US006630643B2

(12) United States Patent
Dueweke

(10) Patent No.: US 6,630,643 B2
(45) Date of Patent: Oct. 7, 2003

(54) METHOD AND STRUCTURE FOR FORMING METALLIC INTERCONNECTIONS USING DIRECTED THERMAL DIFFUSION

(75) Inventor: Michael Dueweke, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/916,533

(22) Filed: Jul. 30, 2001

(65) Prior Publication Data

US 2003/0019851 A1 Jan. 30, 2003

(51) Int. Cl.[7] .................... B23K 26/00

(52) U.S. Cl. .................... 219/121.66; 219/121.14; 219/121.64

(58) Field of Search .................... 219/121.64, 121.66, 219/121.14, 121.6, 121.65, 121.63

(56) References Cited

U.S. PATENT DOCUMENTS 3,610,874 A * 10/1971 Gagliano .................... 219/121.64
4,341,942 A * 7/1982 Chaudhari et al. ..... 219/121.64
4,441,008 A * 4/1984 Chan .................... 219/121.71
4,587,395 A * 5/1986 Oakley et al. ......... 219/121.64
4,642,446 A * 2/1987 Pennington ............ 219/121.64
4,810,663 A 3/1989 Raffel et al.
5,585,602 A 12/1996 Bernstein
5,861,325 A 1/1999 Bernstein
5,920,789 A 7/1999 Bernstein
5,940,727 A 8/1999 Bernstein
6,153,854 A * 11/2000 Haszler et al. ......... 219/121.64
6,380,513 B1 * 4/2002 Remy De Graffenried ....... 219/121.85
6,479,168 B2 * 11/2002 Mazumder et al. ......... 428/659

* cited by examiner

*Primary Examiner*—M. Alexandra Elve
*Assistant Examiner*—Len Tran

(57) ABSTRACT

Energy is applied to a portion of a conducting body. In preferred embodiments, relative motion between the conducting body and the energy source is created such that the energy source moves along a thermal diffusion front, thereby enhancing the thermal diffusion front in the direction of the relative movement. The energy is preferably applied in a portion of the conducting body with higher thermal mass and the enhanced thermal diffusion front is directed toward a portion with lower thermal mass. The lower thermal mass portion expands, thereby creating fissures in surrounding material, then melts, flows through the fissures and contacts another conductor, thereby forming a conductive link.

17 Claims, 4 Drawing Sheets

100
110
220
120
D
250
251
252
253
254
210
200
$D_2$

METHOD AND STRUCTURE FOR FORMING METALLIC INTERCONNECTIONS USING DIRECTED THERMAL DIFFUSION

BACKGROUND OF THE INVENTION

1. Field of the Invention

The present invention relates generally to the field of forming connections and conducting links, and more particularly to forming connections and conductive links by directed thermal diffusion.

2. Discussion of the Background

It is known in the art to form interconnecting links between adjacent or closely situated conductive materials. In particular, in the semiconductor industry, it is necessary to form conductive links after an integrated circuit is formed in a number of applications. For example, because DRAM (dynamic random access memory) circuits sometimes contain manufacturing errors, they are often manufactured with extra rows and/or columns. When one row or column is found to be defective, a fuse is blown to disconnect the defective row or column and one of the extra rows or columns is connected in its place. The connection of the extra row or column is one example of an application wherein a conductive link must be formed. Another example of an application in which such links must be formed is certain types of programmable logic devices.

Several technologies are known for forming such conductive links. For example, anti-fuses are well known in the art. Other examples of forming such links are discussed in U.S. Pat. Nos. 5,940,727, 5,861,325, 5,585,602, 5,920,789 (all to Bernstein) and U.S. Pat. No. 4,810,663 (to Raffel et al.). In the Bernstein technique, the links are formed by heating a conductor separated from another conductor by a dielectric material such that the dielectric material fractures and melted metal flows in fissures formed by the fractured dielectric material to connect the conductors. In the Raffel technique, conductive layers are separated by a material which forms an alloy with the conductive materials when heated by a laser.

There are drawbacks to all of the foregoing links, including, but not limited to, use of non-standard processing steps, low conductivity, potential of damage to surrounding area, and/or the requirement of directing a laser beam at the exact location where an interconnecting link is desired.

SUMMARY OF THE INVENTION

The present invention provides a method for forming a conductive link using a process referred to herein as directed thermal diffusion wherein energy is applied to a conducting body that includes portions with differing thermal mass, with the energy being applied in a portion of the conducting body with relatively higher thermal mass, resulting in a thermal diffusion front directed toward a portion of the conducting body with lower thermal mass. The lower thermal mass portion is surrounded by non-conducting material, while the higher thermal mass portion may or may not be surrounded by non-conducting material. The lower thermal mass portion then expands, thereby creating fissures in the surrounding non-conducting material. Next, the lower thermal mass portion melts and flows through the fissures until contact with another conductor is made, thereby forming a conductive link between the conducting body and the other conductor. In preferred embodiments, relative motion between the conducting body and the energy source is created such that the energy source moves toward the lower thermal mass portion, thereby creating an enhanced thermal diffusion front in the direction of the lower thermal mass portion.

BRIEF DESCRIPTION OF THE DRAWINGS

A more complete appreciation of the invention and many of the attendant advantages and features thereof will be readily obtained as the same becomes better understood by reference to the following detailed description when considered in connection with the accompanying drawings, wherein.

DESCRIPTION OF PREFERRED EMBODIMENTS

The present invention will be discussed with reference to preferred embodiments of methods for forming conductive links using directed thermal diffusion. Specific details, such as dimensions of conducting bodies and materials, are set forth in order to provide a thorough understanding of the present invention. The preferred embodiments discussed herein should not be understood to limit the invention. Furthermore, for ease of understanding, certain method steps are delineated as separate steps; however, these steps should not be construed as necessarily distinct nor order dependent in their performance.

Figure 1:
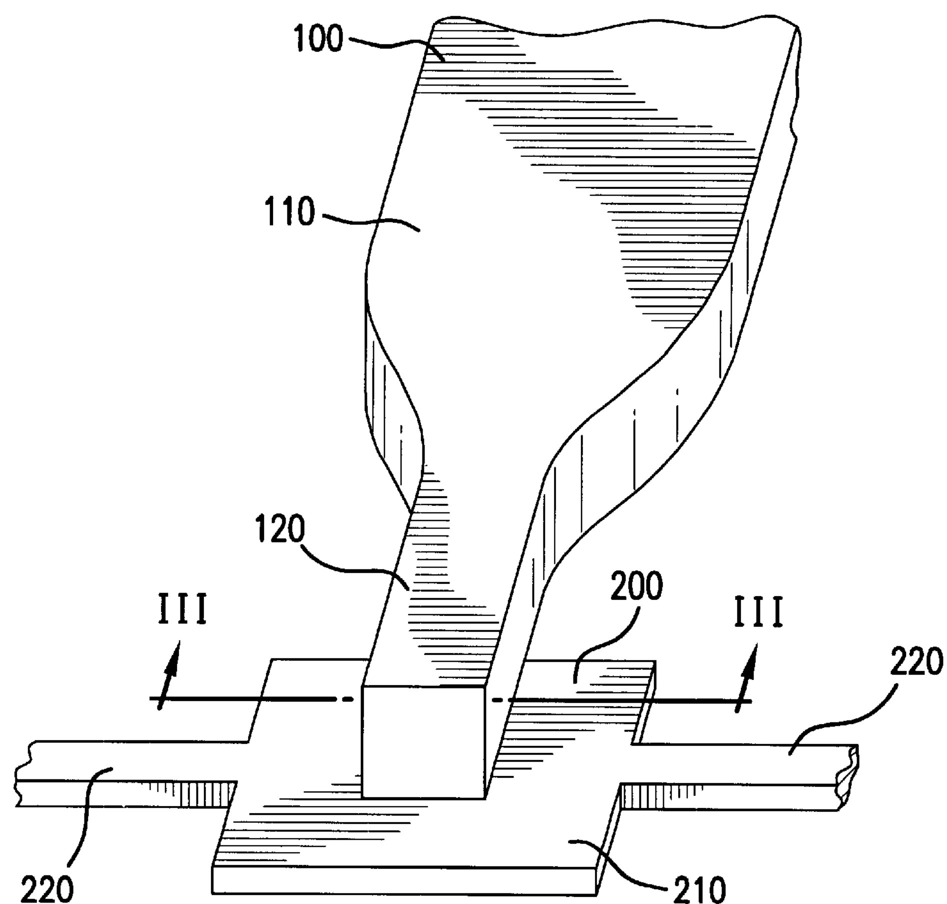
FIG. 1 is a perspective view of a conducting body including portions with higher and lower thermal masses having the portion with the lower thermal mass positioned over another conductor according to one embodiment of the present invention.

FIG. 1 illustrates a conducting body 100 positioned over a target conductor 200. In the embodiment of FIG. 1, it is desired to form a conductive link between the conducting body 100 and the target conductor 200. The conducting body 100 may be formed from any number of conducting materials, but is preferably formed by a metal such as copper, aluminum, or an alloy thereof. The conducting body 100 includes a first portion 110 and a second, tapered portion 120. The first portion 110 is physically larger and of higher thermal mass than the tapered portion 120. In exemplary embodiments, the width of the tapered portion 120 is less than one micron, while the width of the first portion 110 is approximately 10 microns or more. The thickness of both the tapered portion 120 and the first portion 110 may be approximately 1 micron.

In preferred embodiments, the entire conducting body is formed of the same material. However, it is possible to form the first portion 110 from a different material than the second portion 120. For example, the tapered portion 120 could comprise a portion of a line of conducting material and the first portion 110 could comprise a different material formed over the tapered portion 120 (such that the first and second portions 110, 120 are formed by different layers in contact with each other). The tapered portion 120 is positioned over a target conductor 200. The tapered portion 120 is not in contact with the target conductor 200; rather, they are separated by a dielectric material such as BPSG (borophosphoro silicate glass, not shown in FIG. 1). The target conductor 200 includes a wide pad 210 to which is connected narrower conductors 220. The pad 210 may be any conducting material, but is preferably chosen so as to form a good bond with the material in the tapered portion 120 of the conducting body 100.

Figure 2:
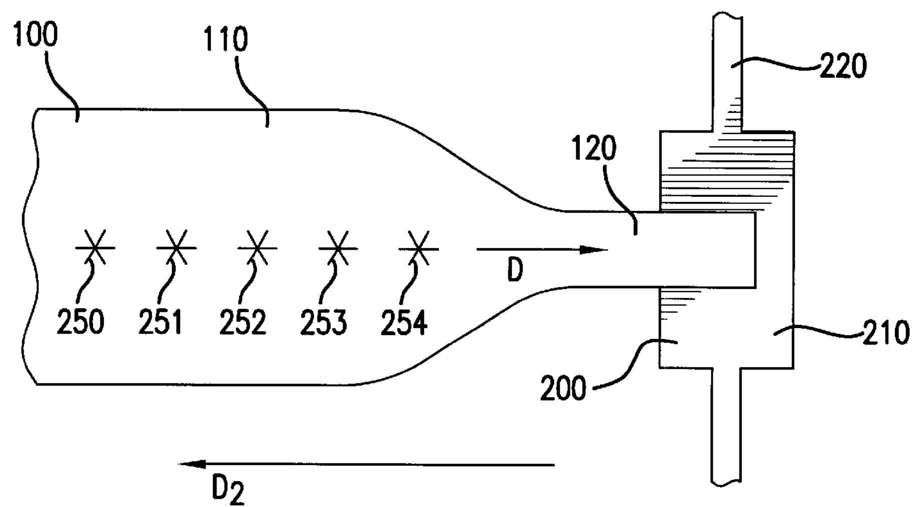
FIG. 2 is a top view of the conducting body of FIG. 1.

Referring now to FIG. 2, the process of forming a conductive link between conducting body 100 and the target conductor 200 starts with an energy pulse 250 being applied to the first portion 110 of conducting body 100. The energy pulse is preferably supplied by a pulsed laser (not shown in FIG. 2). The power and duration of the energy pulse 250 are chosen such that the total heat $\Delta Q=M_1*C_v*\Delta T$ (where $\Delta Q$ is the change in heat, $M_1$ is the thermal mass of the first portion 110, $C_v$ is the thermal conductivity of material in the first portion 110, and $\Delta T$ is the change in temperature) transferred to the first portion 110 does not cause the temperature of the first portion to rise above the melting point. Using the dimensions set forth above, the power of a typical laser pulse will be on the order of a milli-Joule and will last approximately 10 nanoseconds. A second energy pulse 251 is then applied to the first portion 110. The second pulse 251 is spaced apart from the first pulse 250 in a direction D toward the tapered portion 120. The spacing and time between the first and second pulses 250, 251 is chosen such that the thermal diffusion front created by the first pulse 250 is strengthened in a direction D by the second pulse 251. Subsequent pulses 252–254 are then applied along the direction D so as to further strengthen the thermal diffusion front in the direction D toward the tapered portion 120.

Figure 3:
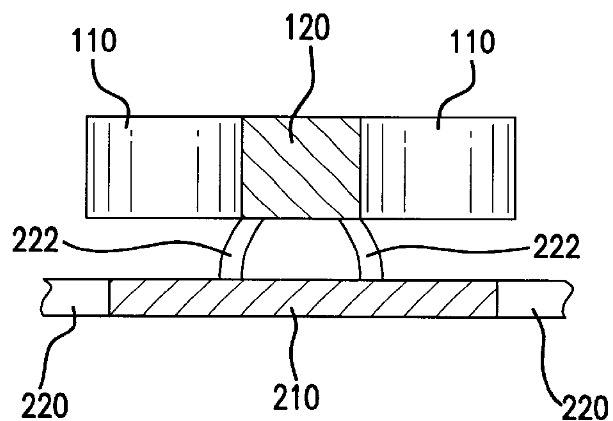
FIG. 3 is a cross sectional view of the conducting body of FIG. 1 taken along the line III—III.

When the thermal diffusion front reaches the tapered portion 120, the energy $\Delta Q=M_2*C_v*\Delta T$ applied to the smaller thermal mass $M_2$ of the tapered portion 120 raises the temperature T of the tapered portion 120. The tapered portion 120 first expands as the temperature T rises. This expansion causes fissures, or cracks, to develop in the dielectric material (not shown in FIG. 2) surrounding the tapered portion 120 and the target 200. The tapered portion 120 then melts. Melted material from the tapered portion 120 then flows in the fissures/cracks to create one or more conductive links 222 to the pad 210 of the target conductor 200 as shown in FIG. 3. The conductive links 222 cool and remain in place after the energy source is removed from the conducting body 100.

Figure 4:
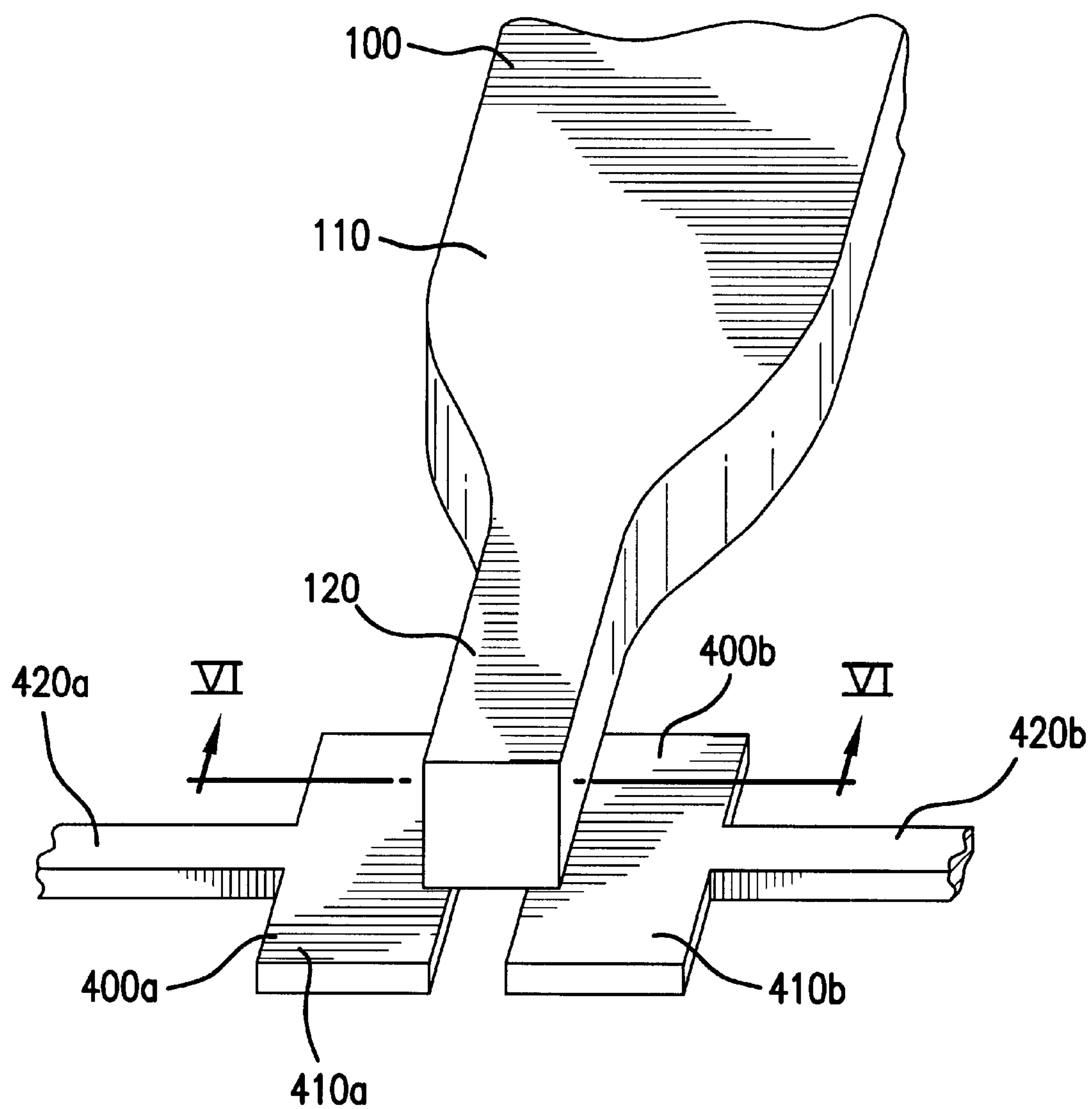
FIG. 4 is a perspective view of a conducting body including portions with higher and lower thermal masses having the portion with the lower thermal mass positioned over two other conductors according to a second embodiment of the present invention.
Figure 5:
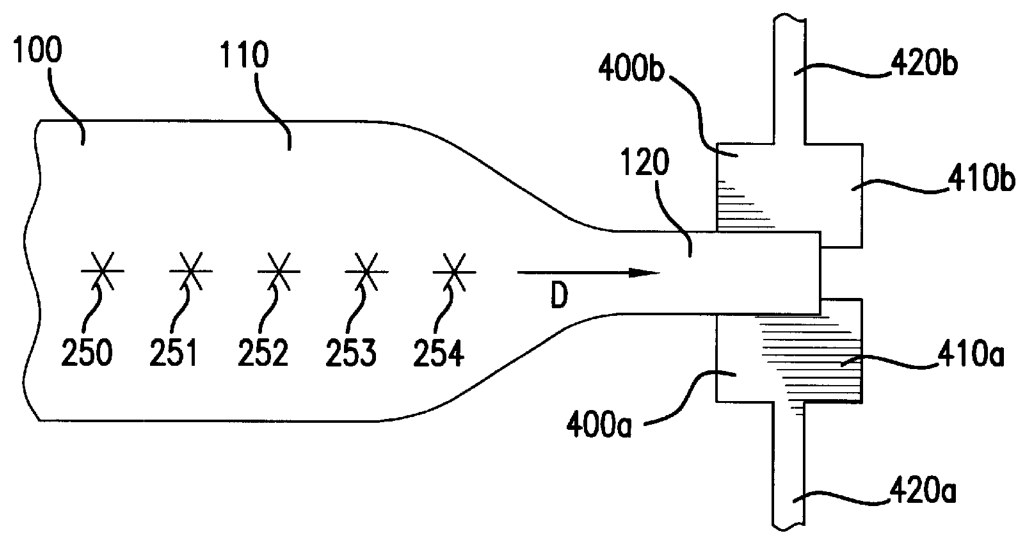
FIG. 5 is a top view of the conducting body of FIG. 4.
Figure 6:
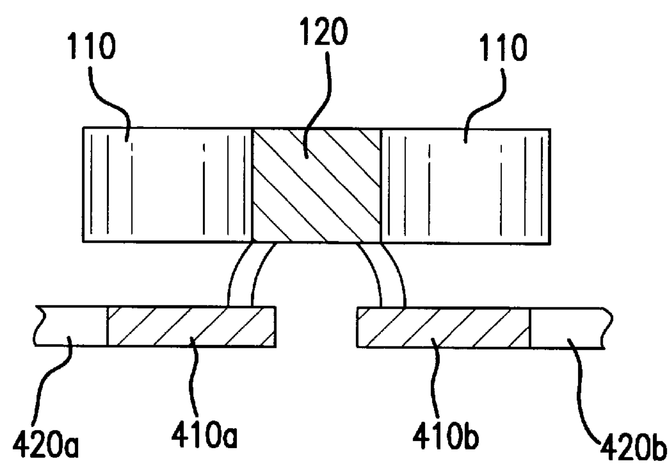
FIG. 6 is a cross sectional view of the conducting body of FIG. 4 taken along the line VI—VI.

A second embodiment of the present invention is shown in FIGS. 4–6. This embodiment is similar to the above embodiment with the exception that connections to two target conductors 400_a_ and 400_b_ must be made. The embodiment of FIGS. 4–6 may therefore be used when the conducting body 100 is provided solely for the purpose of forming the conducting link between the first target 400_a_ and the second target 400_b_ and the first portion 110 is not connected to any other portion of a circuit. This should be contrasted with the embodiment of FIGS. 1–3, where the first portion 110 is connected to one portion of a circuit and the target 200 is connected to a second portion of a circuit.

One aspect of the above-described method is that the energy is supplied to a portion of conducting body 100 at a position remote from the location where the actual link is formed. The ability to form links at locations remote from a location where energy is applied may be of critical importance in some semiconductor applications where the circuit layout is such that directing an energy pulse to the location where the link is required in impossible or impractical.

Another aspect of the embodiment described above is that the relatively large size of the first portion facilitates application of the energy pulses. For example, the focus of the laser beam and the motion control of the laser beam or semiconductor wafer will not require as much precision where the relatively large first portion of the conducting body 100 is provided.

In the embodiments described above, the first portion 110 may is preferably left exposed to facilitate application of the energy pulses 250–254. It is also possible, however, to cover the first portion 110. In such embodiments, the first portion 110 is preferably covered by a transparent substance such as the substances used in many passivation layers and/or dielectrics.

In the preferred embodiments discussed above, the total heat transferred to the first portion 110 does not cause the first portion to melt. However, it is also possible to apply sufficient total heat to melt the first portion 110. This may be particularly useful in embodiments wherein the first portion 110 is left exposed so that the expansion of the first portion 110 due to melting will not crack any surrounding material but rather will expand in the direction of the exposed areas.

In the above-described embodiments, energy may be applied by a pulsed energy source such as a laser beam. It should be understood that it is also possible to apply the energy continuously. It is also possible to move the energy supply with respect to the conduction body, to move the conducting body with respect to the energy supply, or to move both the energy supply and the conducting body so as to create relative motion between them. For example, with reference to the latter two methods, it is possible to move the conducting body in a direction $D_2$ opposite the direction D of the thermal diffusion front as shown in FIG. 2.

Obviously, numerous other modifications and variations of the present invention are possible in light of the above teachings. It is therefore to be understood that within the scope of the appended claims, the invention may be practiced otherwise than as specifically described herein.

What is claimed is:

1. A method for forming a conductive link between a first conducting body and a second conductor, the method comprising the step of:

applying energy to a first portion of the first conducting body with an energy source, the energy source having relative motion in a first direction relative to the first conducting body, the first direction being different from a direction in which the energy is applied;

wherein a first thermal diffusion front is created, the first thermal diffusion front being of higher energy in the first direction than in directions different from the first direction; the first thermal diffusion front having sufficient energy to cause a second portion of the conducting body to melt and form a connection to the second conductor, the second portion of the conducting body being remote from the first portion of the conducting body to which the energy is applied.

2. The method of claim 1, wherein the second portion of the conducting body is tapered relative to the first portion of the conducting body.

3. The method of claim 1, wherein the first portion and the second portion comprise the same material.

4. The method of claim 1, wherein the first portion and the second portion comprise different materials.

5. The method of claim 1, wherein at least one portion comprises a metal.

6. The method of claim 5, wherein the metal is copper.

7. The method of claim 6, wherein the metal is aluminum.

8. The method of claim 1, wherein the energy is applied in a series of pulses.

9. The method of claim 1, wherein the energy is applied continuously.

10. The method of claim 1, wherein the energy is applied by a laser beam.

11. The method of claim 10, wherein the laser beam is moved in the first direction over the conducting body.

12. The method of claim 10, wherein the conducting body is moved in a second direction opposite from the first direction and the laser beam is stationary.

13. The method of claim 1, wherein the first portion is exposed.

14. The method of claim 1, wherein the first portion is covered.

15. The method of claim 1, wherein the first portion is covered by a passivation layer.

16. The method of claim 1, wherein the first portion is covered by a dielectric material.

17. The method of claim 1, wherein the first conducting body and the second conductor are separated by a dielectric material.

* * * * *